United States Patent
Trochut

(10) Patent No.: US 7,176,699 B2
(45) Date of Patent: Feb. 13, 2007

(54) AUTO-ADJUSTMENT OF RC CELLS WITHIN A CIRCUIT

(75) Inventor: Severin Trochut, Gilly sur Isere (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 11/301,345

(22) Filed: Dec. 12, 2005

(65) Prior Publication Data

US 2006/0145681 A1    Jul. 6, 2006

(30) Foreign Application Priority Data

Dec. 14, 2004  (FR) .................................. 04 13286

(51) Int. Cl.
*G01R 27/26* (2006.01)
(52) U.S. Cl. ........................ 324/677; 324/28
(58) Field of Classification Search ................ 324/677, 324/76.28

See application file for complete search history.

(56) References Cited

U.S. PATENT DOCUMENTS 6,737,851 B1    5/2004  Roo ........................ 324/76.28

2004/0169565 A1   9/2004  Gaggl et al. ................ 333/17.1
2005/0270002 A1*  12/2005  Woo ............................ 323/265

FOREIGN PATENT DOCUMENTS

EP    1 455 449 A1    9/2004
JP    10341568 A  *  12/1998

OTHER PUBLICATIONS

Hughes, J., et al: "Self-Tuned RC-Active Filters For VLSI," *Electronic Letters*, 22(19):993-994, Sep. 11, 1986.

* cited by examiner

*Primary Examiner*—Vincent Q. Nguyen
(74) *Attorney, Agent, or Firm*—Lisa K. Jorgenson; David V. Carlson; Seed IP Law Group PLLC

(57) ABSTRACT

An integrated circuit having a first couple of components R and C, at least a second couple of components $R_1$–$R_3$ and $C'_1$–$C'_2$ and a calibration circuit. The couple of componets form an RC cell of which one component is adjustable, and the calibration circuit. The invention corrects the errors in the values of the components of RC cells of the same nature. The calibration circuit performs the adjustment of an RC cell and then applies the same correction to the components of the other RC cells of the same nature.

10 Claims, 6 Drawing Sheets

AUTO-ADJUSTMENT OF RC CELLS WITHIN A CIRCUIT

BACKGROUND OF THE INVENTION

1. Field of the Invention

The invention relates to circuits implementing cells containing resistors and capacitors, more precisely resistor/capacitor couples. More particularly, the invention relates to the adjustment of RC cell time constants within integrated circuits.

2. Description of the Related Art

Currently, a great number of electronic circuits are fabricated as integrated circuits. Some of these electronic circuits use RC cells, in other words resistor/capacitor couples, for performing filtering or timing functions, for example.

By way of example, FIG. 1 shows an integrated circuit 1 incorporating a DC/DC converter designed to transform a battery voltage $V_{BAT}$ into a regulated power supply voltage $V_{CC}$ for powering a circuit represented by the impedance $Z_L$.

The principle implemented by this DC/DC converter is known per se. The battery voltage is chopped by the pair of transistors 10 and 11 controlled by a rectangular signal with a modulated duty cycle. The inductance $L_R$ and the capacitor $C_R$ provide the filtering for this chopped voltage in order to have a DC power supply voltage $V_{CC}$. An error amplifier 12 amplifies the error between the power supply voltage $V_{CC}$ and a reference voltage $V_{Ref}$. A ramp generator 13 supplies a periodic signal in the form of a ramp. A comparator 14 compares the amplified error with the periodic ramp signal. The signal delivered by the comparator 14 corresponds to the rectangular signal with variable duty cycle that controls the pair of transistors. The modulation of the duty cycle depends on the error between the reference and power supply voltages, thus creating a feedback loop that stabilizes the power supply voltage $V_{CC}$.

The DC/DC converter comprises several RC cells. The error amplifier 12 also provides a low-pass filtering function comprising two poles and two zeros in order to stabilize the feedback loop operation. However, the feedback loop must provide a high reactivity, in other words a cut-off frequency that is as high as possible in order to rapidly compensate for a variation in the battery voltage $V_{BAT}$ or in the load $Z_L$ so as to ensure that the DC supply voltage $V_{CC}$ remains constant. The ramp generator 13 can comprise one or more RC cells. The frequency and the form of the periodic ramp signal depends on the time constant of these RC cells.

The precision on the variations in the resistor and capacitor values of the RC cells depends on an accumulation of tolerances associated with the fabrication method of the integrated circuit (notably fabrication mask alignment defects, dispersions in the dopant concentration, thickness tolerances of the layers forming the integrated circuit) and with the operating conditions (notably, power supply voltage, temperature). Currently, the tolerance in the resistor and capacitor values is 35% and 20%, respectively. When an RC cell is produced, the tolerances in the values are cumulative and the resulting tolerance in the time constant is 62%.

Several techniques are known to pre-empt this problem of tolerances. A first technique consists in choosing the circuit dimensions so that it can operate in the worst-case situation. In the example of the DC/DC converter, this means slowing down the regulation loop, in other words reducing the circuit bandwidth. This leads to a loss of performance in terms of regulation. The power supply voltage $V_{CC}$ will take more time to recover to the level of $V_{Ref}$.

A second technique consists in installing passive components external to the integrated circuit so that these can be precisely chosen and/or measured in order to know their exact values. This technique goes counter to achieving the maximum integration of the circuits. It is costly since it requires the addition of external components. In general, it is only used for high-precision circuits or when the passive components cannot be fabricated within the integrated circuit.

A third technique consists in adding compensation elements that counterbalance the drift in the components. This technique is reasonably well controlled but does not simply allow one compensation for all the error factors to be obtained. In the case of the error amplifier 12, the compensation for the resistors $R_1$, $R_2$ and $R_3$ and for the capacitors $C_1$ and $C_2$ is very complex to implement.

A fourth technique involves the use of different circuits that are free of variations. In the case of an amplifier including filtering means, this technique requires a digital circuit that is very complex and very costly in terms of size of silicon chip.

And finally, a fifth technique consists in adjusting the components. The adjustment can be effected by laser during the fabrication method to compensate for the component errors associated with the fabrication method. The adjustment can be made dynamically when the circuit is powered up or during operation. This generally requires the measurement of one or more circuit characteristics, the comparison of the measurements with reference values, then the adjustment of one or more components as a function of this comparison. The adjustment can be made in a single step by means of complex computational means or by means of successive iterations.

The transfer function H(p) of the error amplifier 12 is as follows:

$$H(p) = \frac{(1 + (R_1 + R_2)C_1 p)(1 + R_3 C_2 p)}{(1 + R_1 C_1 p) R_2 C_2 p}$$

The tolerance errors on the resistors $R_1$, $R_2$ and $R_3$ and the capacitors $C_1$ and $C_2$ distort the transfer function H(p) from an ideal characteristic. The adjustment of the components requires several measurement points in order to obtain an approximation of the transfer function and significant computational means for determining from the measured characteristic the corrections to be made to the passive components.

In summary, there does not currently exist any technique for providing a simple correction of the error due to the components in the error amplifier 12 even though the latter is an amplifier equipped with relatively simple filtering means.

BRIEF SUMMARY OF THE INVENTION

The invention proposes a simple solution for correcting the errors in the values of the RC cell components in integrated circuits comprising at least two RC cells of the same nature. Each RC cell comprises one component that has an adjustable value. Calibration means perform the adjustment of one RC cell, then apply the same correction to the components of the other cells of the same nature.

The subject of the invention is an integrated circuit comprising a first component couple, at least a second component couple and a calibration circuit. The first component couple is formed by a resistor and by a capacitor, one of the two components of the first couple being an adjustable component. The second component couple is formed by a resistor of the same nature as the resistor of the first couple and by a capacitor of the same nature as the capacitor of the first couple, one of the two components of the second couple being an adjustable component. The calibration circuit produces an adjustment value for the adjustable component of the first couple in order to compensate for the error in the product of the resistance times the capacitance of the said first couple, the adjustment value also being applied to the adjustable component of the said second couple.

By 'component of the same nature' should be understood components produced by the same fabrication methods. By way of example, two resistors are of the same nature if they are produced simultaneously during the same steps of the fabrication method. They will be fabricated with the same materials that will be subject to the same errors in concentration, the same alignment errors and the same thickness errors. In addition, since these components of the same nature are located nearby in the same circuit, they are subject to the same value variation gradient and they are at the same temperature. In other words, components of the same nature exhibit the same dispersions in fabrication which ascribes them with the same error in value.

BRIEF DESCRIPTION OF THE SEVERAL VIEWS OF THE DRAWINGS

The invention will be better understood and other features and advantages will become apparent upon reading the description that follows, which makes reference to the appended drawings wherein.

DETAILED DESCRIPTION OF THE INVENTION

Figure 1:
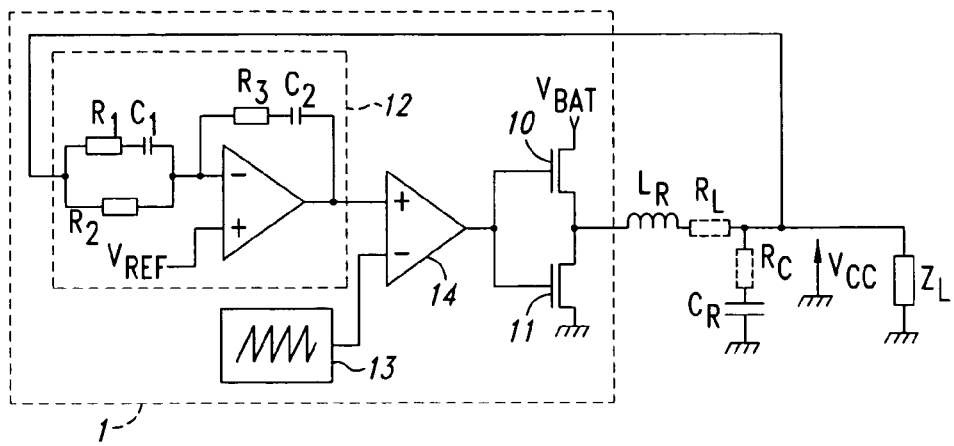
FIG. 1 shows a DC/DC converter of the prior art.
Figure 2:
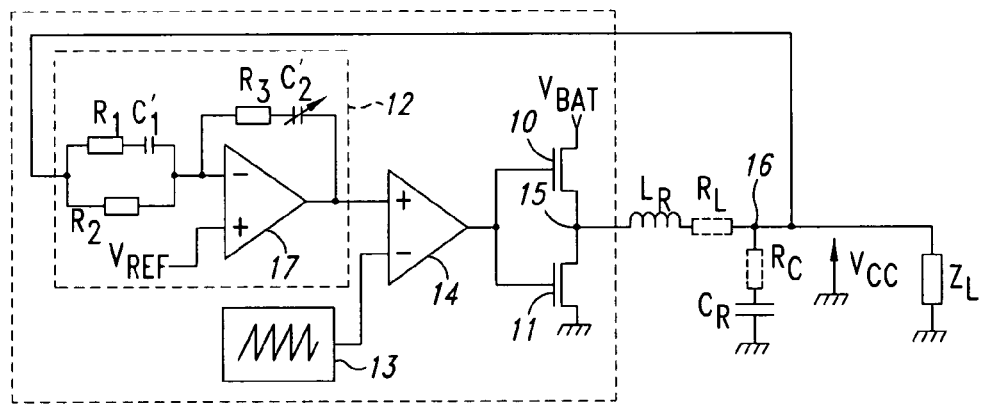
FIG. 2 shows the DC/DC converter from FIG. 1 modified according to the invention.

The invention may be applied to any type of integrated circuit implementing at least two RC cells requiring a given precision. By way of example, an integrated circuit 1 is described (FIG. 2) that incorporates a DC/DC converter designed to transform a battery voltage $V_{BAT}$ into a regulated power supply voltage $V_{CC}$ for supplying a circuit represented by a load impedance $Z_L$. This example is presented purely by way of non-limiting example in order to illustrate an embodiment of the invention.

The DC/DC converter comprises a pair of transistors 10 and 11, an error amplifier 12, a ramp generator 13 and a comparator 14 that are included within the integrated circuit 1. An inductor $L_R$ and a filter capacitor $C_R$ are situated outside of the integrated circuit since their size does not allow them to be fabricated as an integrated circuit.

The transistors 10 and 11 are for example complementary MOS transistors. The channels of the transistors 10 and 11 are connected in series between a conductor receiving the battery voltage $V_{BAT}$ and a conductor connected to ground. The node 15 formed by the drains of the transistors 10 and 11 forms an output of the integrated circuit 1.

The node 15 is connected to a first terminal of the inductor $L_R$. A second terminal of the inductor $L_R$ is connected to a first terminal of the filter capacitor $C_R$ and forms the node 16. A second terminal of the filter capacitor $C_R$ is connected to ground. The node 16 is connected to the circuit to be powered in order to supply the voltage $V_{CC}$.

The node 16 forms an input of the integrated circuit 1. The node 16 is connected to an input of the error amplifier 12. An output of the error amplifier 12 is connected to a first input of the comparator 14.

The ramp generator 13 has an output connected to a second input of the comparator 14. The ramp generator 13 delivers a periodic signal in the form of a ramp at its output.

The comparator 14 also has an output connected to the gates of the transistors 10 and 11. The comparator 14 delivers a signal in a first state when the output signal of the error amplifier 12 is at a voltage that is higher than the voltage of the periodic signal in the form of a ramp, and in a second state when the output signal of the error amplifier 12 is at a voltage that is lower than the voltage of the periodic signal in the form of a ramp.

The output signal of the comparator 14 controls the bases of the transistors 10 and 11 which cause the battery voltage $V_{BAT}$ to be chopped. The chopped voltage at the node 15 is filtered by the inductor $L_R$ and the filter capacitor $C_R$ in order to obtain the DC power supply voltage $V_{CC}$.

The error amplifier 12 comprises an operational amplifier 17 having a positive input, a negative input and an output. The positive input receives a reference voltage $V_{Ref}$. The voltage $V_{Ref}$ is supplied by a reference voltage generator not shown. The reference voltage generator is a circuit using for example stacked diode junctions, and it is compensated in order to deliver a reference voltage that is stable and free of any variations associated with the fabrication method, the temperature, the battery voltage or any other factors.

The negative input of the operational amplifier 17 is connected to the input of the amplifier 12 via a first branch comprising a resistor $R_1$ and a capacitor $C'_1$ in series, and via a second branch comprising a resistor $R_2$. The negative input is also linked to the output of the operational amplifier 17, which also forms the output of the error amplifier 12, via a third branch comprising a resistor $R_3$ in series with a capacitor $C'_2$. The variable signal transfer function H(p) of the error amplifier 12 is the following:

$$H(p) = \frac{(1 + (R_1 + R_2)C'_1 p)(1 + R_3 C'_2 p)}{(1 + R_1 C'_1 p) R_2 C'_2 p}$$

The operation of the DC/DC converter is the same as that of the prior art. The error amplifier 12, the ramp generator 13 and the comparator 14 produce a rectangular signal for controlling the transistors 10 and 11. The duty cycle of the rectangular signal is closed-loop controlled from the power supply voltage $V_{CC}$ by the error amplifier 12.

Figure 3:
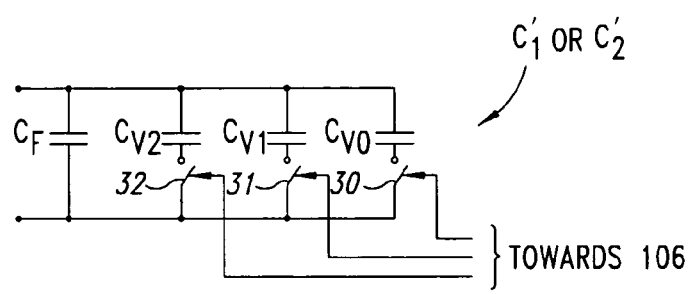
FIG. 3 shows an example of variable capacitor implemented in the invention.

However, the capacitors $C'_1$ and $C'_2$ are adjustable capacitors that are adjusted according to the invention to values which compensate, at the same time, for the value error of the resistors and the value error of the capacitors. The capacitors $C'_1$ and $C'_2$ are for example formed as is shown in FIG. 3 and they each comprise a capacitor $C_F$ of fixed value coupled in parallel with capacitors $C_{V0}$, $C_{V1}$, $C_{V2}$ via switches 30 to 32, respectively. The switches 30 to 32 are for example formed using MOS transistors.

In FIG. 3, the variable part only comprises 3 capacitors in order to simplify the circuit diagrams, but there should be a larger number of capacitors in order to improve the precision of the compensation. The values of the capacitors $C_{V0}$, $C_{V1}$, $C_{V2}$ correspond to a binary decomposition of the variable part. Considering the nominal value $C_N$ of a capacitor $C'_1$ or $C'_2$, this nominal value may be written as:

$$C_N = C_F + C_V,$$

with $C_V = \Sigma(a_i * C_{Vi})$, $a_i$ being the $i^{th}$ bit of a binary control word A whose value determines the closed or open state of the switch corresponding to the capacitor $C_{Vi}$, and with $C_{Vi} = 2^i * C_{V0}$. Also, $C_V = k * C_{V0}$, with k the value of the word A, k being an integer between 0 and $2^n - 1$, n being the number of bits in the word A.

In the transfer function H(p), a capacitance value is always associated with a resistance value. This resistor-capacitor couple is known by the name RC cell. The purpose of the capacitors $C'_1$ and $C'_2$ is to compensate for the value errors of the RC couple.

For a given RC couple, the nominal values are $R_N$ and $C_N$. However, these nominal values are respectively modified by the errors $\delta$ and $\epsilon$ in the components. Then:

$$RC = R_N * (1+\delta) * C_N * (1+\epsilon)$$

Now, as is indicated, the value of $C_N$ comprises a variable part that aims to obtain $RC = R_N C_N$, which leads to the following equation for obtaining the values of $C_F$ and $C_V$:

$$R_N C_N = R_N * (1+\delta) * (C_F + C_V) * (1+\epsilon)$$

For the worst case situation, this equation yields the two following inequalities:

$$C_N \geq (1+\delta_{MAX}) * (1+\epsilon_{MAX}) * C_F$$

$$C_N \leq (1+\delta_{MIN}) * (1+\epsilon_{MIN}) * (C_F + C_{VMAX})$$

If the same calculation is performed by considering the resistors as variable elements, similar inequalities are obtained. For the error amplifier 12, it is preferable to make the capacitors vary rather than the resistors since switched variable resistors would introduce parasitic capacitances which would modify the variable signal transfer function H(p). Variable capacitors also have parallel parasitic capacitances but these only have the effect of modifying the global value of the capacitor which is itself corrected. In addition, a capacitor coupled with parasitic capacitances remains a capacitor overall.

Those skilled in the art may notice that it is not easy to carry out measurements on the error amplifier 12 that allow the determination of the adjustment to be applied to the capacitors $C'_1$ and $C'_2$. However, it should be pointed out that, in an integrated circuit, the value errors can be significant but that, for components of the same nature placed close to one another, these errors are virtually the same. In this present case, the DC/DC converter is sufficiently small for all the components of the same nature to be considered as subject to the same error.

By 'component of the same nature' should be understood components produced by the same fabrication methods. By way of example, two resistors are of the same nature if they are produced simultaneously during the same steps of the fabrication method. They will be fabricated with the same materials that will be subject to the same errors in concentration, the same alignment errors and the same thickness errors. In addition, since these components of the same nature are located nearby in the same circuit, they are at the same temperature. Two components of the same nature exhibit the same error and the same drift in value.

Rather than determining the variable value of the capacitors $C'_1$ and $C'_2$ in the error amplifier 12, the invention proposes that this correction be carried out in another circuit comprising an RC cell, for example in the ramp generator 13. It should be noted that, if there were no other RC cells in the DC/DC converter, it would have been possible to add a simple circuit comprising an RC cell that could easily be compensated.

Figure 4:
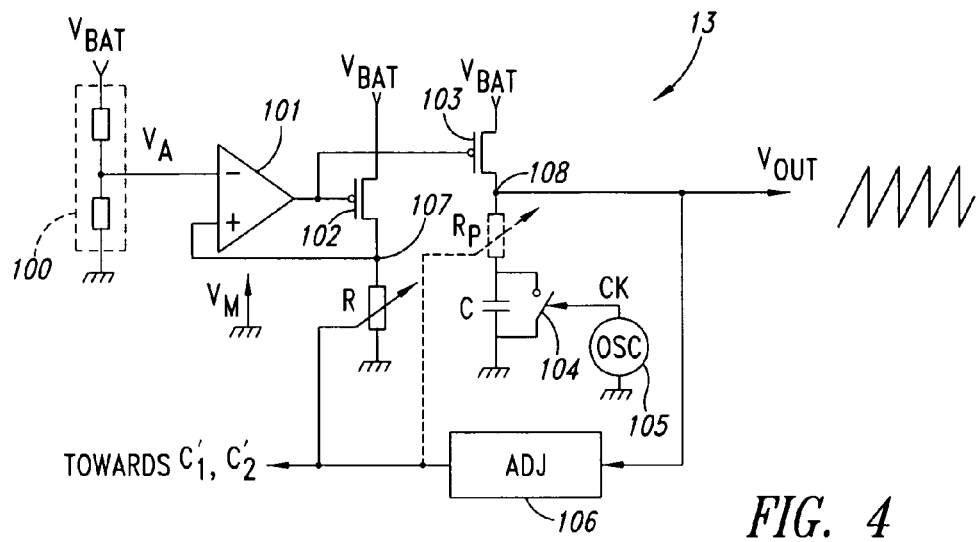
FIG. 4 shows an example of ramp generator according to the invention.

The ramp generator 13, shown in FIG. 4, corresponds to a simple circuit implementing an RC cell that is easily compensated. The ramp generator 13 comprises a potential divider 100, an operational amplifier 101, a pair of transistors 102 and 103, a resistor R, a capacitor C, a switch 104, an oscillator 105 and a calibration circuit 106.

The potential divider 100 is a series resistance bridge. The resistors of the potential divider 100 both have an error in their value, but since this error is the same for the two resistors, the error is compensated. The potential divider 100 is connected between a battery voltage and a ground voltage in order to supply a reference voltage $V_A$ to a negative input of the operational amplifier 101. The output of the operational amplifier 101 is connected, on the one hand, to the gate of the transistor 102 and, on the other, to the gate of the transistor 103. A positive input of the operational amplifier 101 is connected to the node 107 formed by a first terminal of the resistor R and the drain of the transistor 102. A second terminal of the resistor R is connected to ground. The source of the transistor 102 is connected to a conductor supplying the battery voltage $V_{BAT}$. The operational amplifier 101 and the transistor 102 behave with respect to the node 107 as a follower amplifier. The node 107 is thus set at the reference potential $V_A$.

The source of the transistor 103 is connected to a conductor supplying the battery voltage $V_{BAT}$. The drain of the transistor 103 is connected to the node 108 that forms the output of the ramp generator 13. A first terminal of the capacitor C is connected to the node 108. A second terminal of the capacitor C is connected to ground. The capacitor C is short-circuited by the switch 104. The switch 104 is controlled by the oscillator 105. The calibration circuit 106 has an input connected to the node 108, and an output connected, on the one hand, to a control terminal of the resistor R and, on the other, to the control terminals of the capacitors $C'_1$ and $C'_2$.

The transistors 102 and 103 are identical PMOS transistors controlled by the same gate-source voltage and therefore deliver the same current on their drains. Now, the current delivered by the transistor 102 is fixed by the resistor R in order to set the node 107 at a potential equal to the reference voltage $V_A$. The current flowing through the conduction channels of the transistors 102 and 103 is therefore equal to $V_A/R$.

The output of the ramp generator 13 is connected to the comparator 14 whose input current is considered to be zero. Furthermore, the input current of the calibration circuit 106 is also considered to be zero. Consequently, the drain current of the transistor 103 flows through the capacitor C when the switch 104 is open, and flows through the switch 104 when the latter is closed.

The oscillator 105 is an oscillating circuit that delivers a signal CK composed of a stream of short pulses separated by a period T. The oscillator 105 is not subject to an RC constant variation, since it is for example based on a ring oscillator. When a pulse arrives, the switch 104 closes and discharges the capacitor C very quickly. The voltage $V_{OUT}$ of the node 108 is brought back to ground voltage. Between two pulses, the switch 104 is open and the capacitor charges up at constant current equal to the drain current of the transistor 103. At the end of the period T, the voltage $V_{OUT}$ is then equal to a maximum voltage $V_{OUTMAX}$.

$$V_{OUTMAX} = \frac{T \times V_A}{R \times C}$$

The resistor R is an adjustable resistor controlled by the calibration circuit 106. During a calibration phase, the calibration circuit compares the value $V_{OUTMAX}$ with a desired value and modifies the value of the resistor R in consequence in order to compensate for the errors in the components R and C.

It should be noted that the generator can comprise a base resistor $R_P$ in series with the capacitor C if it is desired to set a minimum voltage for the output signal. The addition of this resistor $R_P$ does not change anything in the calibration principle but it must be a variable resistor that is subject to a variation proportional to the variation in R. In the following, this resistor $R_P$ is not included for reasons of simplification.

Figure 5:
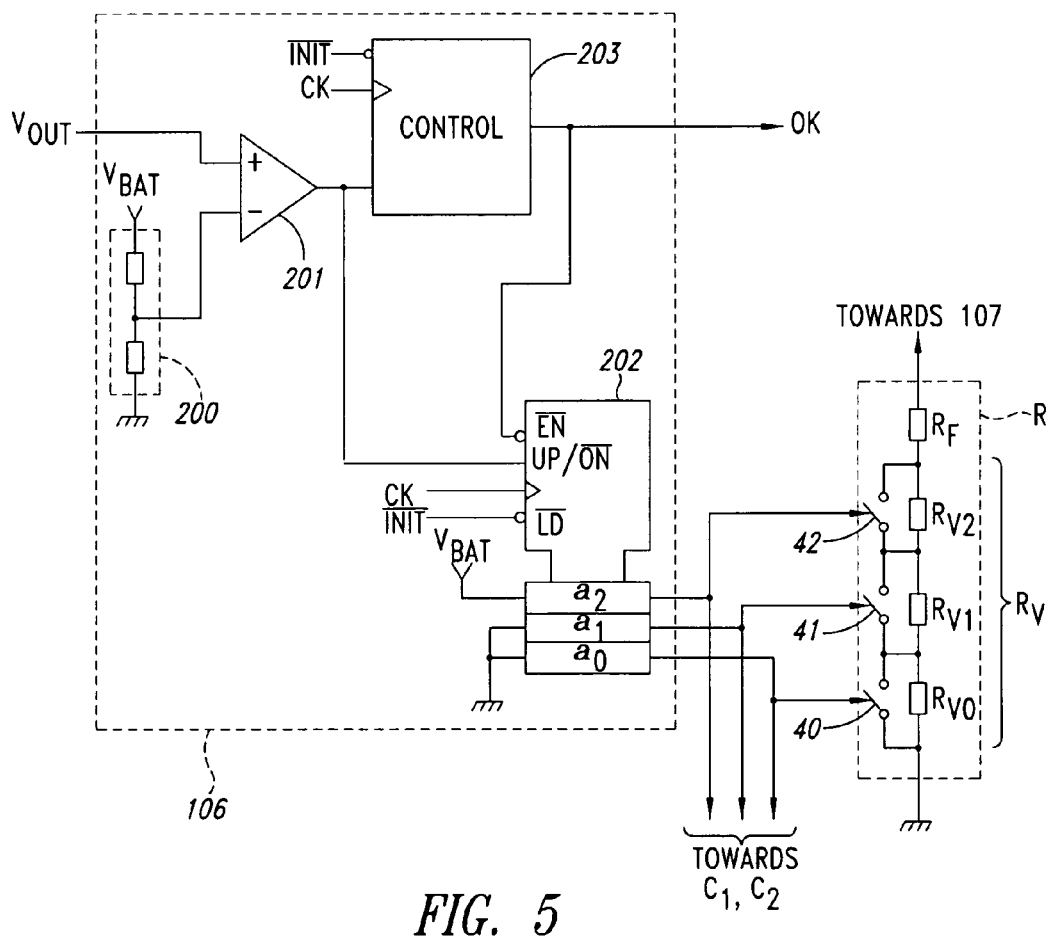
FIG. 5 shows a first calibration circuit according to the invention.

FIG. 5 shows an example of a calibration circuit 106 and of the resistor R. The resistor R comprises a fixed resistor $R_F$ in series with resistors $R_{V2}$, $R_{V1}$ and $R_{V0}$. Each resistor $R_{V0}$, $R_{V1}$ or $R_{V2}$ can be short-circuited by the switches 40, 41 or 42, respectively. The switches 40 to 42 are for example formed using MOS transistors.

In FIG. 5, the variable part $R_V$ only comprises 3 resistors $R_{V0}$, $R_{V1}$ and $R_{V2}$. A larger number of resistors improves the precision of the compensation. The values of the resistors $R_{V0}$, $R_{V1}$, and $R_{V2}$ correspond to a binary decomposition of the variable part $R_V$ of the resistor R. Considering the nominal value $R_N$ of the resistor R, this nominal value can be written:

$$R_N = R_F + R_V$$

with $R_V = \Sigma(a_i * R_{Vi})$, $a_i$ being the $i^{th}$ bit of a binary control word A, whose value determines the closed or open state of the switches 40 to 42, corresponding to the resistor $R_{Vi}$, and with $R_{Vi} = 2^i * R_{V0}$. Also, $R_V = k * R_{V0}$, with k the value of the word A, k being an integer varying between 0 and $2^n - 1$, n being the number of bits in the word A.

In the ramp generator 13, the maximum voltage $V_{OUTMAX}$ depends on a value of capacitor C associated with a value of resistor R. This resistor-capacitor couple forms an RC cell. The resistor R compensates for the errors of this RC couple. Here, the resistor R works in constant current mode. The parasitic capacitances associated with resistor switching have no effect on this circuit.

For this RC couple, the nominal values are $R_N$ and $C_N$, however these nominal values are respectively modified by the errors $\delta$ and $\epsilon$ in the components. These errors $\delta$ and $\epsilon$ are the same as for the error amplifier 12 as long as the resistors are of the same nature and the capacitors are also of the same nature. Then:

$$RC = R_N * (1+\delta) * C_N * (1+\epsilon)$$

Now, as indicated, the resistor R comprises a variable part that aims to obtain $RC = R_N C_N$ which leads to the following equation for obtaining the values of $R_F$ and $R_V$:

$$R_N C_N = (R_F + R_V) * (1+\delta) * C_N * (1+\epsilon)$$

For the worst case situation, the equation yields the two following inequalities:

$$R_N \geq (1+\delta_{MAX}) * (1+\epsilon_{MAX}) * R_F$$

$$R_N \leq (1+\delta_{MIN}) * (1+\epsilon_{MIN}) * (R_F + R_{VMAX})$$

Thanks to these inequalities, that are identical to those obtained for the capacitors of the error amplifier 12, the value of the resistor R can be defined as follows:

$$R = R_F + (A * R_{V0})$$

with:

$$R_F = b * R_N \text{ and } A_{MAX} * R_{V0} = c * R_N,$$

b and c being coefficients chosen that verify the following inequalities:

$$b \leq \frac{1}{(1+\delta_{MAX})(1+\varepsilon_{MAX})}$$

$$c \geq \frac{1}{(1+\delta_{MIN})(1+\varepsilon_{MIN})} - b$$

In order for the correction to be identical, the same coefficients should be chosen for all the variable components that are controlled by the calibration circuit. As an example, for error values $\delta_{MAX} = -\delta_{MIN} = 0.35$ and $\epsilon_{MAX} = -\epsilon_{MIN} = 0.2$, b=0.6 and c=1.4 can be chosen. The precision of the error α in the RC couple then becomes equal to the error in the resolution of R, in other words $R_{V0}$:

$$\alpha = \frac{c \times \delta}{2^n - 1}$$

This error α depends on the number n of bits in the word A and therefore on the adjustment precision of the variable components. For c=1.4 and n=3, the maximum error $\alpha_{MAX}$ is equal to 7%. This error $\alpha_{MAX}$ becomes equal to 0.8% for n=6 and 0.2% for n=8. Those skilled in the art will therefore modify n depending on the desired precision. The calibration circuit 106 will be limited to n=3 for reasons of simplification and ease of understanding.

The calibration circuit 106 comprises a potential divider 200, a comparator 201, a counter 202 and a control circuit 203.

The potential divider 200 is formed by two resistors, of the same nature, in series that mutually compensate one another since they are subject to the same external influences and they were fabricated together. The potential divider 200 is connected between the battery voltage $V_{BAT}$ and ground voltage, and it delivers a maximum desired voltage $V_{MS}$ at an output.

The comparator 201 comprises a negative input connected to the output of the potential divider 200, a positive input connected to the node 108, and an output. The comparator 201 performs a permanent comparison between the output voltage $V_{OUT}$ and the maximum desired voltage $V_{MS}$. The output of the comparator 201 is in a first state, for example the "1" state, when the voltage $V_{OUT}$ is higher than the voltage $V_{MS}$. The output of the comparator 201 is in a second state, for example the "0" state, when the voltage $V_{OUT}$ is lower than the voltage $V_{MS}$.

The counter 202 comprises a counting enable input $\overline{EN}$ that is active low, a count up/count down input UP/$\overline{DN}$, a clock input, a pre-loading input $\overline{LD}$, three data inputs and three data outputs. When it is active, the enable input $\overline{EN}$ authorizes the counter to count up or count down. This enable input $\overline{EN}$ is connected to the output of the control circuit 203. The count up/count down input UP/$\overline{DN}$ indicates, depending on its state, whether the counter must count up or count down on an active clock edge. The clock input is connected to the oscillator 105 and receives the signal CK. The pre-loading input $\overline{LD}$ receives a reset signal $\overline{INIT}$. When the pre-loading input $\overline{LD}$ is active, an asynchronous loading of the data presented at the data inputs resets the counter. The data inputs are preferably connected to the battery-voltage $V_{BAT}$ for the most-significant bit, and to ground voltage for the other bits. Upon activation of the pre-loading input $\overline{LD}$, the counter will be set at a mean value. The data outputs are connected to the switches 30 to 32 and 40 to 42 of the variable components R, C'$_1$ and C'$_2$. The data outputs supply the value contained in the counter 202. The counter increments its value on an active edge of the signal CK if the enable input $\overline{EN}$ is active and if the count up/count down input UP/$\overline{DN}$ is in a "1" state. The counter decrements its value on an active edge of the signal CK if the enable input $\overline{EN}$ is active and if the count up/count down input UP/$\overline{DN}$ is in a "0" state.

The control circuit 203 comprises an input connected to the output of the comparator 201, a clock input receiving the signal CK, a reset input receiving the signal $\overline{INIT}$, and an output connected to the enable input $\overline{EN}$ of the counter 202 and delivering a signal OK. The signal OK is representative of the state of the calibration. When the signal OK is at "0", the calibration is running. When the signal OK is at "1", the calibration is finished. This circuit detects and stores the output state of the comparator 201 when active edges of the signal CK arrive. The output of the comparator indicates, at the times corresponding to these active edges, whether the maximum output voltage $V_{OUTMAX}$ is higher or lower than the desired maximum voltage $V_{MS}$. When the maximum output voltage $V_{OUTMAX}$ goes from a higher value to a lower value, or from a lower value to a higher value with respect to the desired maximum voltage $V_{MS}$, the signal OK goes to the level "1".

Figure 6:
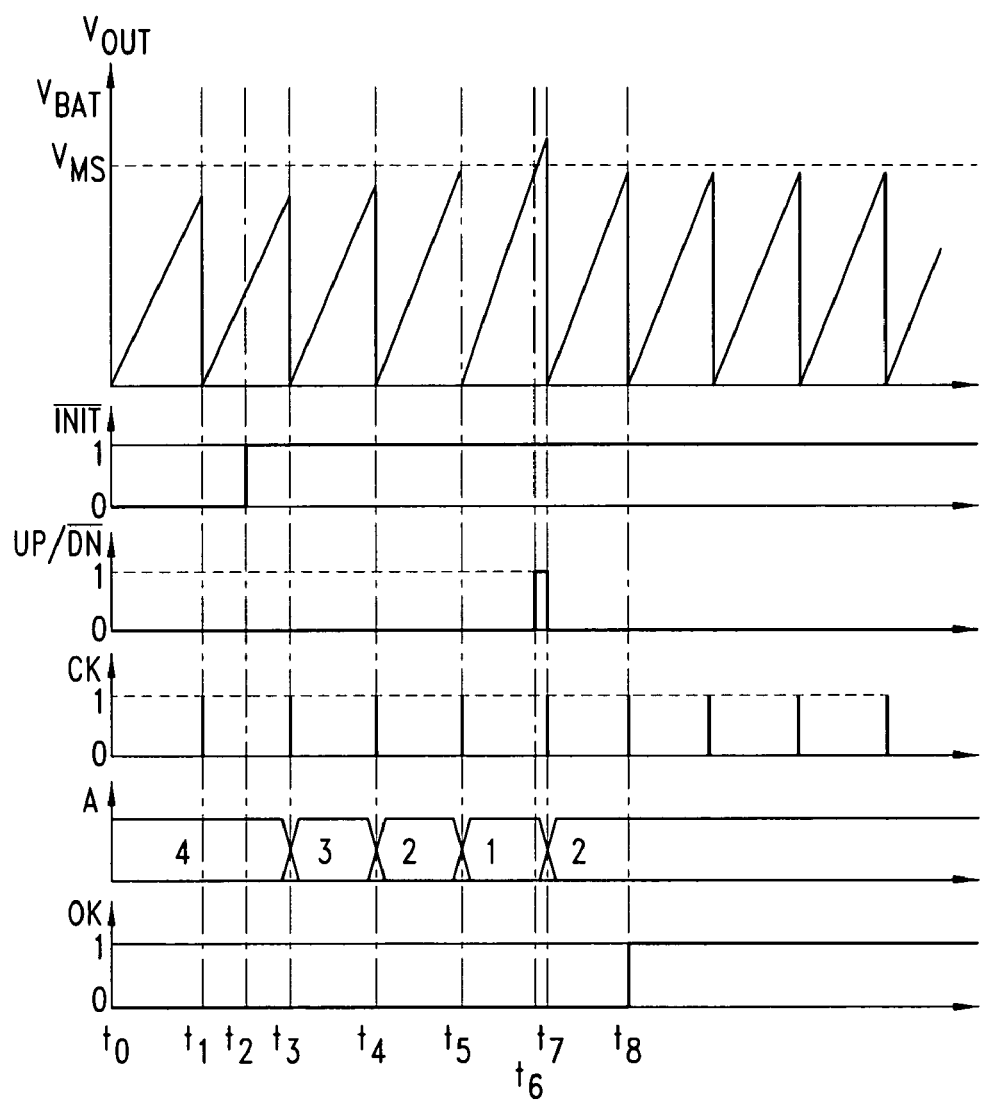
FIGS. 6 and 7 illustrate the calibration of the ramp generator by means of the first calibration circuit.

The operation of the calibration circuit 106 will now be described with the aid of FIGS. 6 and 7. FIG. 6 corresponds to a calibration for a negative error in the RC product which corresponds to $(1+\delta)*(1+\epsilon)<1$.

The start of the calibration begins at time $t_0$ by setting the reset signal $\overline{INIT}$ to the "0" state. The signal OK is set to "0". The counter 202 loads the value A, for example equal to "4" for a 3-bit counter. The capacitor C charges up with a current equal to $$\frac{V_A}{(R_F + 4R_{V0})(1+\delta)}.$$

Between $t_0$ and $t_1$, the output of the comparator remained in the "0" state since the output voltage $V_{OUT}$ still remained below the desired maximum voltage $V_{MS}$. At time $t_1$, the pulse of the signal CK discharges the capacitor C and the voltage $V_{OUT}$ becomes equal to 0V. The pulse at time $t_1$ is inoperative on the counter 202 because the reset signal $\overline{INIT}$ is still active. The capacitor C charges up with a current equal to $$\frac{V_A}{(R_F + 4R_{V0})(1+\delta)}.$$

At time $t_2$, the reset signal $\overline{INIT}$ becomes inactive and the calibration begins.

Between $t_1$ and $t_3$, the output of the comparator remained at "0" since the output voltage $V_{OUT}$ still remained below the desired maximum voltage $V_{MS}$.

At time $t_3$, the output of the comparator that corresponds to the input UP/$\overline{DN}$ is in the "0" state. The signal OK is at "0". The pulse of the signal CK then decrements the counter 202 and sets it to the value "3". Still at time $t_3$, the pulse of the signal CK discharges the capacitor C and the voltage $V_{OUT}$ becomes equal to 0V. The capacitor C then charges up with a current equal to $$\frac{V_A}{(R_F + 3R_{V0})(1+\delta)}.$$

Between $t_3$ and $t_4$, the output of the comparator remains in the "0" state since the output voltage $V_{OUT}$ is below the desired maximum voltage $V_{MS}$.

At time $t_4$, everything happens as at time $t_3$, and the counter counts down to the value "2". The capacitor C then charges up with a current equal to $$\frac{V_A}{(R_F + 2R_{V0})(1+\delta)}.$$

Between $t_4$ and $t_5$, the output of the comparator 201 remains at "0" since the output voltage $V_{OUT}$ remains below the desired maximum voltage $V_{MS}$.

At time $t_5$, everything happens as at time $t_4$, and the counter counts down to the value "1". The capacitor C then charges up with a current equal to $$\frac{V_A}{(R_F + R_{V0})(1+\delta)}.$$

Between $t_5$ and $t_6$, the output of the comparator is in the "0" state since the output voltage $V_{OUT}$ is below the desired maximum voltage $V_{MS}$. But, at time $t_6$, the output voltage $V_{OUT}$ becomes higher than the desired maximum voltage $V_{MS}$. The output of the comparator 201 goes to "1" and remains at "1" until the pulse at time $t_7$.

At time $t_7$, the output of the comparator which corresponds to the input UP/$\overline{DN}$ is in the "1" state. The signal OK is at "0". The pulse of the signal CK then increments the counter 202 and sets it to the value "2". The signal OK then flips to the "1" state. Still at time $t_7$, the pulse of the signal CK discharges the capacitor C and the voltage $V_{OUT}$ becomes equal to 0V. The capacitor C then charges up with a current equal to $$\frac{V_A}{(R_F + 2R_{V0})(1+\delta)}.$$

Between $t_7$ and $t_8$, the output of the comparator 201 remains in the "0" state since the output voltage $V_{OUT}$ remains below the desired maximum voltage $V_{MS}$.

At time $t_8$, the signal OK is at "1". The pulse of the signal CK is inoperative on the counter 202 which remains at the value "2". The capacitor C then charges up after each pulse with a current equal to $$\frac{V_A}{(R_F + 2R_{V0})(1 + \delta)}.$$

The calibration of the ramp generator is finished but also the calibration of all the couples of the RC type of the error amplifier 12.

Figure 7:
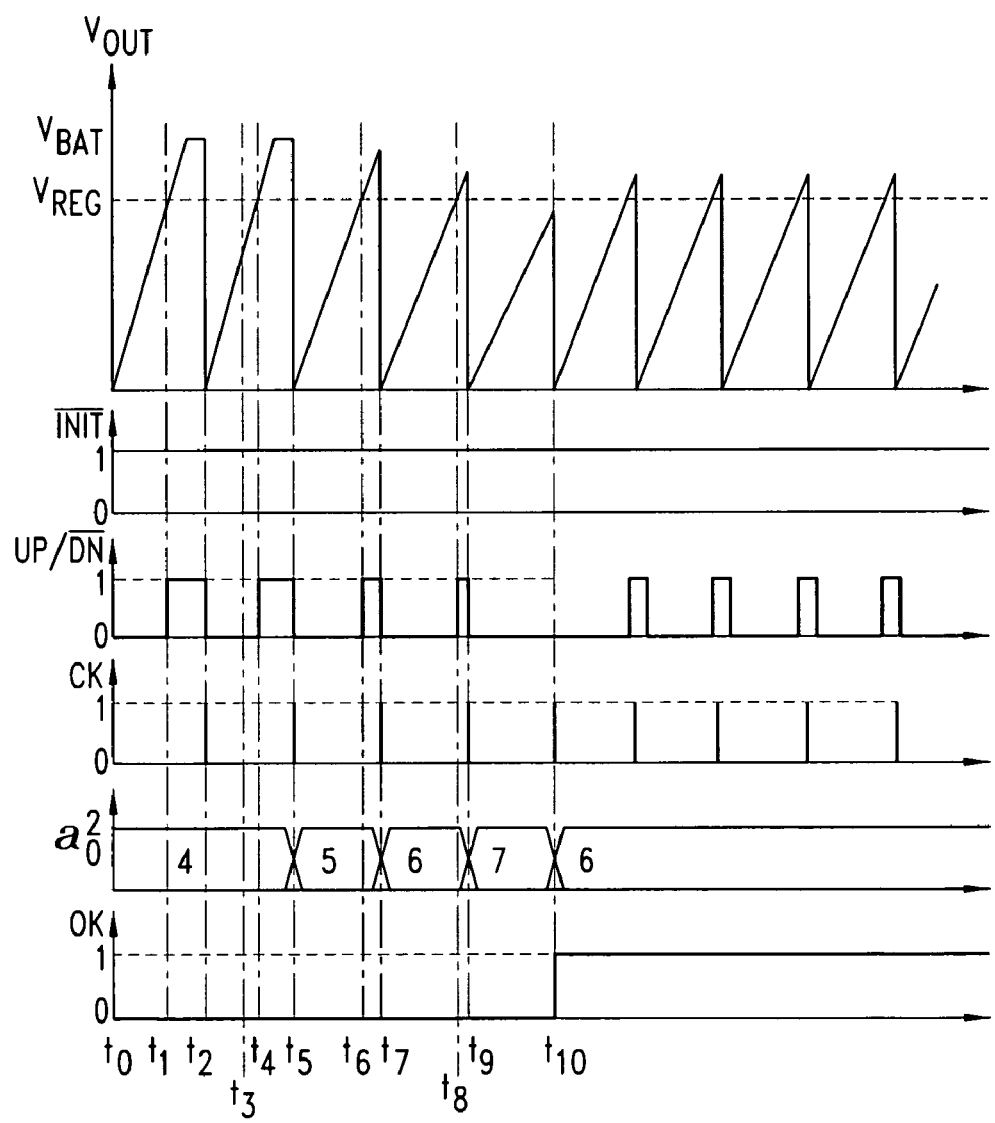

FIG. 7 corresponds to a calibration for a positive error in the RC product which corresponds to $(1+\delta)*(1+\epsilon)>1$.

The start of the calibration begins at time to by setting the state of the reset signal $\overline{\text{INIT}}$ to "0". The signal OK is set to "0". The counter 202 loads the value A, for example equal to "4" for a 3-bit counter. The capacitor C charges up with a current equal to $$\frac{V_A}{(R_F + 4R_{V0})(1 + \delta)}.$$

Between $t_0$ and $t_1$, the output of the comparator 201 is in the "0" state since the output voltage $V_{OUT}$ is lower than the desired maximum voltage $V_{MS}$. At time $t_1$, the output voltage $V_{OUT}$ goes above the desired maximum voltage $V_{MS}$ and the output of the comparator goes to the "1" state until time $t_2$.

At time $t_2$, the pulse of the signal CK discharges the capacitor C and the voltage $V_{OUT}$ becomes equal to 0. The pulse at time $t_2$ is inoperative on the counter 202 since the reset signal $\overline{\text{INIT}}$ is still active. The capacitor C charges up with a current equal to $$\frac{V_A}{(R_F + 4R_{V0})(1 + \delta)}.$$

At time $t_3$, the reset signal INIT becomes inactive and the calibration begins.

Between $t_2$ and $t_4$, the output of the comparator 201 is in the "0" state since the output voltage $V_{OUT}$ is below the maximum desired voltage $V_{MS}$. At time $t_4$, the output voltage $V_{OUT}$ goes above the desired maximum voltage $V_{MS}$ and the output of the comparator 201 goes to the "1" state until time $t_5$.

At time $t_5$, the output of the comparator 201, which corresponds to the input UP/$\overline{\text{DN}}$, is in the "1" state. The signal OK is at "0". The pulse of the signal CK then increments the counter 202 and sets it to the value "5". Still at time $t_3$, the pulse of the signal CK discharges the capacitor C and the voltage $V_{OUT}$ becomes equal to 0V. The capacitor C then charges up with a current equal to $$\frac{V_A}{(R_F + 5R_{V0})(1 + \delta)}.$$

Between $t_5$ and $t_6$, the output of the comparator 201 is in the "0" state. At $t_6$, the voltage $V_{OUT}$ goes above the voltage $V_{MS}$. From $t_6$ to $t_7$, the output of the comparator 201 is in the "1" state.

At time $t_7$, the output of the comparator 201 is in the "1" state. The signal OK is at "0". The pulse of the signal CK then increments the counter 202 and sets it to the value "6". Still at time $t_7$, the pulse of the signal CK discharges the capacitor C and the voltage $V_{OUT}$ becomes equal to 0V. The capacitor C then charges up with a current equal to $$\frac{V_A}{(R_F + 6R_{V0})(1 + \delta)}.$$

Between $t_7$ and $t_8$, the output of the comparator is in the "0" state. At time $t_8$, the output voltage $V_{OUT}$ becomes higher than the desired maximum voltage $V_{MS}$. The output of the comparator 201 goes to "1" and remains at "1" until the arrival of the pulse at time $t_9$.

At time $t_9$, the output of the comparator is in the "1" state. The signal OK is at "0". The pulse of the signal CK then increments the counter 202 and sets it to the value "7". Still at time $t_9$, the pulse of the signal CK discharges the capacitor C and the voltage $V_{OUT}$ becomes equal to 0V. The capacitor C then charges up with a current equal to $$\frac{V_A}{(R_F + 7R_{V0})(1 + \delta)}.$$

Between $t_9$ and $t_{10}$, the output of the comparator remains in the "0" state.

At time $t_{10}$, the output of the comparator is in the "0" state. The signal OK is at "0". The pulse of the signal CK then decrements the counter 202 and sets it to the value "6". The signal OK then flips to the "1" state. Still at time $t_{10}$, the pulse of the signal CK discharges the capacitor C and the voltage $V_{OUT}$ becomes equal to 0V. The capacitor C then charges up with a current equal to $$\frac{V_A}{(R_F + 6R_{V0})(1 + \delta)}.$$

After $t_{10}$, the signal OK is in the "1" state. The pulse of the signal CK is inoperative on the counter 202 that remains at the value "6". The capacitor C then charges up after each pulse with a current equal to $$\frac{V_A}{(R_F + 6R_{V0})(1 + \delta)}.$$

The calibration of the ramp generator is finished but also the calibration of all the couples of the RC type of the error amplifier 12.

The calibration precision depends on the number n of bits in the word A. In order to increase the precision, the number of bits would need to be increased. The calibration time depends on the errors $\delta$ and $\epsilon$ but also on the number n of bits in A. In the worst case situation, the number of pulses required for the calibration is equal to $2^{n-1}+1$.

Statistically, this worst case situation rarely happens since the fabrication methods are centred and the errors $\delta$ and $\epsilon$ are less than 1% for 60% of the circuits produced. The calibration speed can be improved by choosing to have a fixed value $R_F$ equal to zero and a maximum variable value equal to two times the nominal value: $R_{VMAX}=2*R_N$. Positioning the counter at A/2 allows it to be close to the value to be reached in 60% of the cases.

Figure 8:
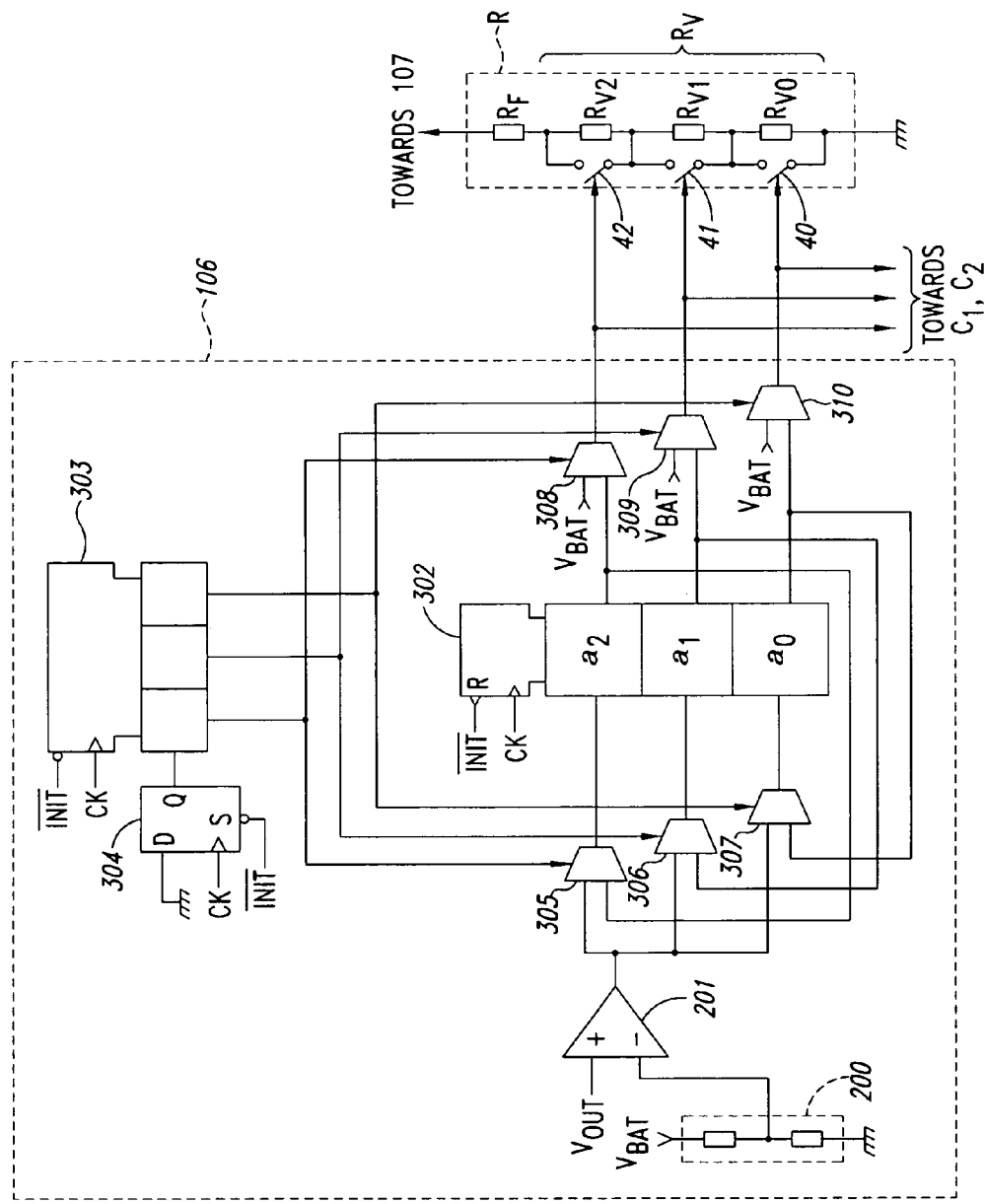
FIG. 8 shows a second calibration circuit according to the invention.

However, it is possible to improve the calibration time independently of the error values $\delta$ and $\epsilon$. FIG. 8 shows a variant of the calibration circuit 106 that implements an evaluation referred to as successive weighting.

The calibration circuit 106 comprises a potential divider 200, a comparator 201, a register 302, a shift register 303, a flip-flop 304 and six multiplexers 305 to 310.

The potential divider 200 and the comparator 201 are the same as for the circuit previously described.

The register 302 comprises a reset input receiving the reset signal $\overline{INIT}$, a clock input receiving the signal CK, three data inputs and three data outputs. The reset input, that is active low, resets the contents of the register 302 to zero. On each active edge of the clock signal, the register 302 stores the data present at the data inputs. The data delivered at the outputs correspond to the stored data.

The shift register 303 comprises a reset input receiving the reset signal $\overline{INIT}$, a clock input receiving the signal CK, a data input and three data outputs. The reset input, that is active low, resets the contents of the shift register 303 to zero. On each active edge of the clock signal, the shift register 303 shifts its contents by one bit, from the most-significant bits towards the least-significant bits, and stores the bit present at its data input as the most-significant bit. The data delivered at the outputs correspond to the data stored in the shift register 303.

The flip-flop 304 is a D flip-flop that comprises a data input D connected to ground, a clock input receiving the signal CK, a reset-high input receiving the reset signal $\overline{INIT}$, and a data output Q. The output Q is connected to the data input of the shift register 303.

The six multiplexers 305 to 310 each comprise a first and a second data input, a selection input and an output. Each multiplexer 305 to 310 connects its output to its first input when the selection input is in the "1" state and connects its output to its second input when the selection input is in the "0" state.

The outputs of the multiplexers 305 to 307 are respectively connected to the data inputs of the register 302. The first inputs of the multiplexers 305 to 307 are connected to the output of the comparator 201. The second inputs of the multiplexers 305 to 307 are respectively connected to the outputs of the register 302. The selection inputs of the multiplexers 305 to 307 are respectively connected to the outputs of the shift register 303.

The outputs of the multiplexers 308 to 310 are respectively connected to the control inputs of the switches 42 to 40. The first inputs of the multiplexers 308 to 310 receive the battery voltage $V_{BAT}$. The second inputs of the multiplexers 308 to 310 are respectively connected to the outputs of the register 302. The selection inputs of the multiplexers 308 to 310 are respectively connected to the outputs of the shift register 303.

Figure 9:
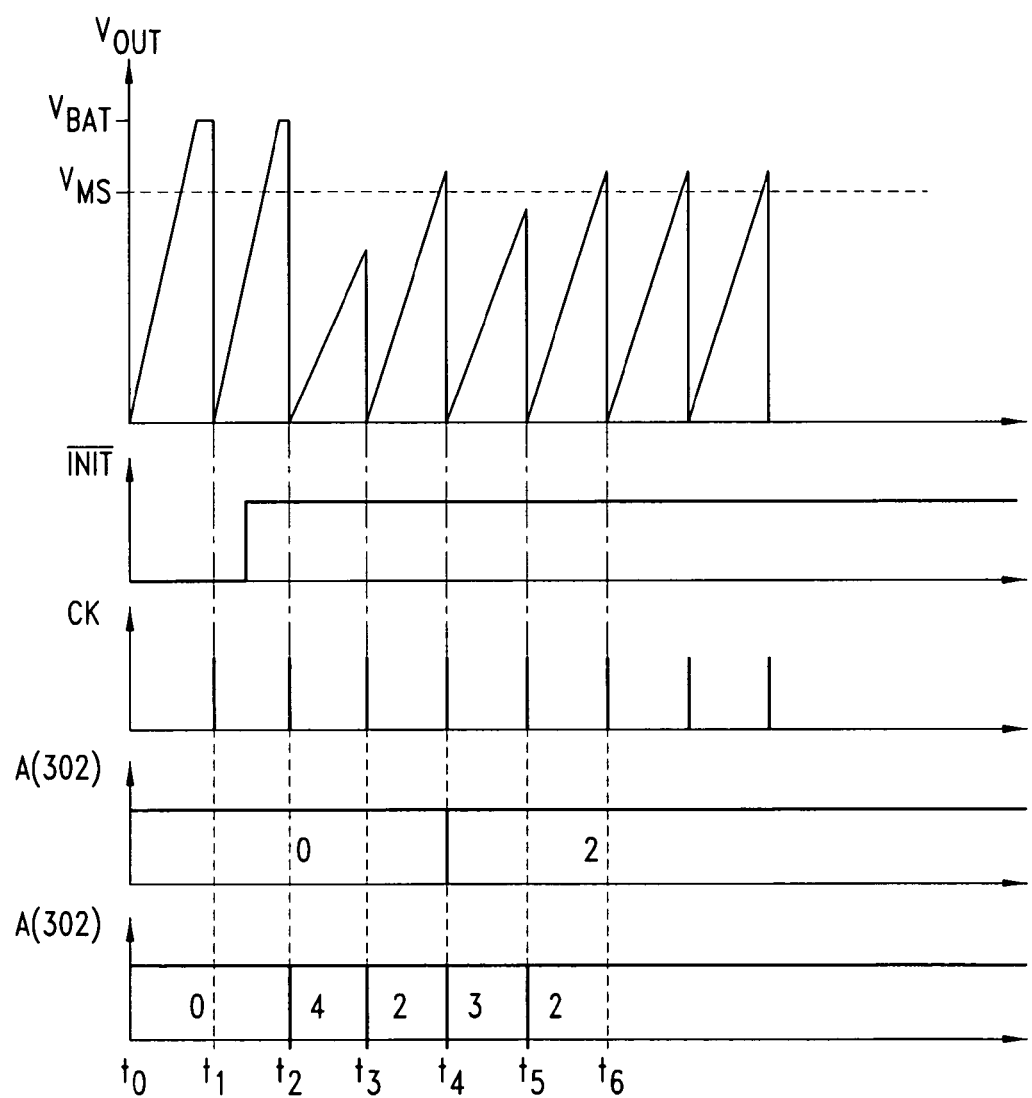
FIG. 9 illustrates the calibration of the ramp generator by means of the second calibration circuit.

The operation of the calibration circuit 106 in FIG. 8 is explained with the aid of FIG. 9.

At time $t_0$, the reset signal $\overline{INIT}$ is set to "0" to indicate the start of the reset operation. In a similar manner to the reset signal $\overline{INIT}$, the registers 302 and 303 are driven to zero and the flip-flop 304 is driven to "1". At time $t_1$, the pulse of the signal CK is inoperative on the registers 302 and 303.

From $t_0$ until $t_2$, the selection inputs of the multiplexers 308 to 310 are at "0". The switches 40 to 42 are connected to the contents of the register whose value is "0". In FIG. 6, the value A seen by the resistor R is denoted A(R) and the value A contained in the register 302 is denoted A(302). The capacitor C charges up with a current equal to $$\frac{V_A}{R_F(1+\delta)}.$$

Between $t_1$ and $t_2$, the reset signal $\overline{INIT}$ is reset to "1" and the calibration begins.

Shortly before time $t_2$, the selection inputs of the multiplexers 305 to 307 are at "0" and the inputs of the register 302 are connected to its outputs. The output of the flip-flop 304 delivers a "1".

When the pulse of the signal CK arrives at time $t_2$, the register 302 stores its own contents. The register 303 stores a "1" as its most-significant bit. The flip-flop 304 stores a "0". The capacitor C is short-circuited and the voltage $V_{OUT}$ becomes zero.

After $t_2$ and until $t_3$, the multiplexer 308 receives a "1" at its selection input and connects its output to its first input. The multiplexers 309 and 310 receive "0"s at their selection inputs and connect their outputs to their second inputs. The value A seen by the resistor is equal to "4" whereas the contents of the register are equal to "0". The capacitor C charges up with a current equal to $$\frac{V_A}{(R_F+4R_{V0})(1+\delta)}.$$

Shortly before time $t_3$, the selection input of the multiplexer 305 is at "1", connecting the input corresponding to the most-significant bit of the register 302 to the output of the comparator 201. Since the voltage $V_{OUT}$ is lower than the voltage $V_{MS}$, the output of the comparator 201 is at "0" The selection inputs of the multiplexers 306 and 307 are at "0", connecting the two least-significant bit inputs of the register 302 to its least-significant bit outputs. The output of the flip-flop 304 delivers a "0".

At time $t_3$ and in response to the pulse of the signal CK, the register 302 stores the value initially present at its inputs, namely the value "0". The register 303 shifts its contents by one bit in the direction of the least-significant bits and loads a "0" as the most-significant bit. The flip-flop 304 stores a "0". The capacitor C is short-circuited and the voltage $V_{OUT}$ becomes zero.

After $t_3$ and until $t_4$, the multiplexer 309 receives a "1" at its selection input and connects its output to its first input. The multiplexers 308 and 310 receive "0"s at their selection inputs and connect their outputs to their second inputs. The value A seen by the resistor is equal to "2", whereas the contents of the register are equal to "0". The capacitor C charges up with a current equal to $$\frac{V_A}{(R_F+2R_{V0})(1+\delta)}.$$

Shortly before time $t_4$, the selection input of the multiplexer 306 is at "1", connecting the input corresponding to the intermediate bit of the register 302 to the output of the comparator 201. Since the voltage $V_{OUT}$ is higher than the voltage $V_{MS}$, the output of the comparator 201 is at "1". The selection inputs of the multiplexers 305 and 307 are at "0", connecting the two most-significant and least-significant bit inputs of the register 302 to its most-significant and least-significant bit outputs. The output of the flip-flop 304 delivers a "0".

At time $t_4$ and in response to the pulse of the signal CK, the register 302 stores the value initially present at its inputs, namely the value "2". The register 303 shifts its contents by one bit in the direction of the least-significant bits and loads a "0" as the most-significant bit. The flip-flop 304 stores a "0". The capacitor C is short-circuited and the voltage $V_{OUT}$ becomes zero.

After $t_4$ and until $t_5$, the multiplexer 310 receives a "1" at its selection input and connects its output to its first input. The multiplexers 308 and 309 receive "0"s at their selection inputs and connect their outputs to their second inputs. The value A seen by the resistor is equal to "3", whereas the contents of the register are equal to "2". The capacitor C charges up with a current equal to $$\frac{V_A}{(R_F + 3R_{VO})(1 + \delta)}.$$

Shortly before time $t_5$, the selection input of the multiplexer 307 is at "1", connecting the input corresponding to the least-significant bit of the register 302 to the output of the comparator 201. Since the voltage $V_{OUT}$ is lower than the voltage $V_{MS}$, the output of the comparator 201 is at "0". The selection inputs of the multiplexers 305 and 306 are at "0", connecting the two most-significant bit inputs of the register 302 to its most-significant bit outputs. The output of the flip-flop 304 delivers a "0".

At time $t_5$ and in response to the pulse of the signal CK, the register 302 stores the value initially present at its inputs, namely the value "2". The register 303 shifts its contents by one bit in the direction of the least-significant bits and loads a "0" as the most-significant bit. The flip-flop 304 stores a "0". The capacitor C is short-circuited and the voltage $V_{OUT}$ becomes zero.

After $t_5$, the calibration is finished. The register 303 is set at "0" and can only remain at "0". The multiplexers 305 to 310 receive "0"s at their selection inputs and connect their outputs to their second inputs. The value A seen by the resistor is equal to the value A contained in the register 302, which is for example equal to "2". The capacitor C charges up with a current equal to $$\frac{V_A}{(R_F + 2R_{VO})(1 + \delta)}.$$

As each pulse of the signal CK arrives, the register 303 shifts "0"s and the register 302 stores its own contents. The pulses of the signal CK are now only used for discharging the capacitor C.

This calibration circuit allows the calibration to be carried out by means of a fixed number of pulses of the signal CK. The fixed number of pulses is equal to n+1, with n being the number of bits in the word A.

Many variants of the invention are feasible. The invention may be applied to any type of circuit and not only to a DC/DC converter. The calibration circuit is used in a ramp generator, but it could be placed within another circuit as long as it is a simple circuit.

In the present description, the calibration is carried out on a resistor and is applied to capacitors. The inverse operation could have been carried out if it would have been more practical to perform the calibration of a capacitor.

An important point is the proportionality between the variable components. The coefficients b and c to be applied to the nominal values of the components in order to obtain the fixed and variable values of the components should preferably be the same. A slight difference in these coefficients can be tolerated, but this introduces a slight error.

Similarly, the variable components described have the same precision. This is not absolutely necessary, and it is possible to perform a calibration of one component using eight bits but to only use a number of bits reduced for example to six in order to control the other components. In this case, the most-significant bits are used.

The exemplary embodiment of the present description relates to a circuit produced as an integrated circuit since the invention is particularly appropriate for integrated circuits. However, this invention may also be used with discrete components but in a more limited manner. The components of the same nature do not exhibit the special property of having the same value error since two discrete components of different values cannot be fabricated together in the same method steps. However, if these components are strictly made by the same manufacturer with the same materials, the components exhibit an identical dynamic drift (especially in temperature). It is therefore possible to dynamically compensate these values.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An electronic circuit, comprising:
a first couple of components formed by a resistor and a capacitor, at least one of the components of the first couple being an adjustable component; and
at least a second couple of components formed by a resistor of the same nature as the resistor of the first couple and a capacitor of the same nature as the capacitor of the first couple, at least one of the components of the second couple being an adjustable component;
a calibration circuit for producing an adjustment value for the adjustable component of the first couple in order to compensate for the error in the product of the resistance by the capacitance of the said first couple, the adjustment value also being applied to the adjustable component of the said second couple.

2. The electronic circuit according to claim 1 wherein the adjustment value of the adjustable component of the first couple is applied proportionally to the value of the adjustable component of the second couple with respect to the value of the adjustable component of the first couple.

3. The electronic circuit according to claim 1 wherein the adjustable component of the first couple is the resistor, and/or the adjustable component of the second couple is the capacitor.

4. The electronic circuit according to claim 1 wherein the adjustable components of the first and second couples each comprise a fixed part and a variable part, and wherein the ratio between the fixed part and the variable part of a variable component is the same for the first and second couples.

5. The electronic circuit according to claim 1, comprising a ramp generator that includes the first component couple and wherein the calibration circuit adjusts the value of the adjustable component of the first couple as a function of the output signal of the ramp generator.

6. The electronic circuit according to claim 5 wherein the calibration circuit comprises a comparator for comparing the maximum voltage of the output signal with a predefined voltage, and a counter for incrementing and/or decrementing the value of the adjustable component of the first couple depending on an output state of the comparator.

7. The electronic circuit according to claim 6 wherein the counter is reset to a mean value at the start of a calibration of the variable component.

8. The electronic circuit according to claim 5 wherein the calibration circuit comprises:

a value register for storing a binary word that is representative of the variable value of the adjustable component, the said register being reset to zero at the start of the calibration of the adjustable component;

means capable of successively applying a bit in the "1" state from the most significant to the least significant bit of the binary word;

a comparator for comparing the maximum voltage of the output signal ($V_{OUTMAX}$) with a predefined voltage; and means for storing or not the bit in the "1" state in the value register depending on an output state of the comparator.

9. The electronic circuit according to claim 1, comprising a DC/DC converter, the said converter including the first and second component couples and the calibration circuit.

10. The electronic circuit according to claim 1, the said electronic circuit being produced as an integrated circuit on a silicon substrate.

* * * * *